United States Patent
Mizoguchi (10) Patent No.: US 9,508,528 B2
(45) Date of Patent: Nov. 29, 2016

(54) METHOD FOR CORRECTING DRIFT OF ACCELERATING VOLTAGE, METHOD FOR CORRECTING DRIFT OF CHARGED PARTICLE BEAM, AND CHARGED PARTICLE BEAM WRITING APPARATUS

(71) Applicant: NuFlare Technology, Inc., Yokohama (JP)

(72) Inventor: Hironori Mizoguchi, Hakodate (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 14/838,848

(22) Filed: Aug. 28, 2015

(65) Prior Publication Data

US 2016/0093466 A1   Mar. 31, 2016

(30) Foreign Application Priority Data

Sep. 30, 2014   (JP) ................. 2014-201876

(51) Int. Cl.
*H01J 37/00*   (2006.01)
*H01J 37/317*  (2006.01)
*H01J 37/21*   (2006.01)
(Continued)

(52) U.S. Cl.
CPC ............ *H01J 37/3174* (2013.01); *H01J 37/21* (2013.01); *H01J 37/241* (2013.01); *H01J 37/28* (2013.01); *H01J 37/304* (2013.01);
(Continued)

(58) Field of Classification Search
CPC ...... H01J 37/28; H01J 37/153; H01J 37/244; H01J 37/256

USPC .............................. 250/307, 310, 396 R, 397
See application file for complete search history.

(56) References Cited

U.S. PATENT DOCUMENTS 6,495,841 B1 * 12/2002 Ando ................. B82Y 10/00
                                                     250/398
7,560,693 B2 *  7/2009 Kuribara ............... H01J 37/20
                                                     250/306

(Continued)

FOREIGN PATENT DOCUMENTS

KR   10-2014-0077119   6/2014
WO   WO 2009/136441    11/2009

OTHER PUBLICATIONS

Korean Patent Office Action issued Apr. 4, 2016 in corresponding Korean Application No. 10-2015-0134577 with English translation (12 pages).

(Continued)

*Primary Examiner* — Tung X Le
(74) *Attorney, Agent, or Firm* — Oblon, McClelland, Maier & Neustadt, L.L.P.

(57) ABSTRACT

A method for correcting a drift of an accelerating voltage includes measuring, after a position of a focus of a charged particle beam has been adjusted based on a first adjustment value and a predetermined time period has passed, a second adjustment value when the position of the focus of the charged particle beam is newly adjusted, calculating a deviation amount between the first adjustment value and the second adjustment value, calculating, using a correlation stored in a storage device, a correction value of an accelerating voltage to be applied to a beam source which emits the charged particle beam, where the correction value corresponds to the deviation amount, and correcting the accelerating voltage to be applied to the beam source, by using the correlation value.

13 Claims, 8 Drawing Sheets

(51) Int. Cl.
*H01J 37/24* (2006.01)
*H01J 37/28* (2006.01)
*H01J 37/304* (2006.01)

(52) U.S. Cl.
CPC ............ *H01J 2237/3045* (2013.01); *H01J 2237/30461* (2013.01); *H01J 2237/31776* (2013.01)

(56) References Cited

U.S. PATENT DOCUMENTS

| | | | | |
|---|---|---|---|---|
| 9,312,094 B2* | 4/2016 | Akima | | H01J 37/153 |
| 2005/0184237 A1* | 8/2005 | Takane | | G06T 5/50 |
| | | | | 250/311 |
| 2006/0060781 A1* | 3/2006 | Watanabe | | B82Y 10/00 |
| | | | | 250/310 |
| 2011/0057114 A1 | 3/2011 | Yamada et al. | | |
| 2011/0147586 A1* | 6/2011 | Fukuda | | H01J 37/153 |
| | | | | 250/310 |
| 2013/0320210 A1* | 12/2013 | Yamada | | H01J 37/1471 |
| | | | | 250/307 |

OTHER PUBLICATIONS

Decision of Refusal from Korean Intellectual Property Office dated Sep. 8, 2016, issued in Korean Patent Application No. 10-2015-0134577 (with English translation).

\* cited by examiner

| Deviation Amount | Correction Amount |
|---|---|
| ┆ | ┆ |

METHOD FOR CORRECTING DRIFT OF ACCELERATING VOLTAGE, METHOD FOR CORRECTING DRIFT OF CHARGED PARTICLE BEAM, AND CHARGED PARTICLE BEAM WRITING APPARATUS

CROSS-REFERENCE TO RELATED APPLICATION

This application is based upon and claims the benefit of priority from the prior Japanese Patent Application No. 2014-201876 filed on Sep. 30, 2014 in Japan, the entire contents of which are incorporated herein by reference.

BACKGROUND OF THE INVENTION

Field of the Invention

Embodiments of the present invention relate generally to a method for correcting a drift of an accelerating voltage, method for correcting drift of a charged particle beam, and a charged particle beam writing apparatus, and more specifically, relate to a method for correcting drift of an accelerating voltage applied to a beam source of an electron beam writing apparatus, for example.

Description of Related Art

The lithography technique that advances miniaturization of semiconductor devices is extremely important as a unique process whereby patterns are formed in semiconductor manufacturing. In recent years, with high integration of LSI, the line width (critical dimension) required for semiconductor device circuits is decreasing year by year. For forming a desired circuit pattern on such semiconductor devices, a master or "original" pattern (also called a mask or a reticle) of high accuracy is needed. Thus, the electron beam (EB) writing technique, which intrinsically has excellent resolution, is used for producing such a high-precision master pattern.

Figure 10:
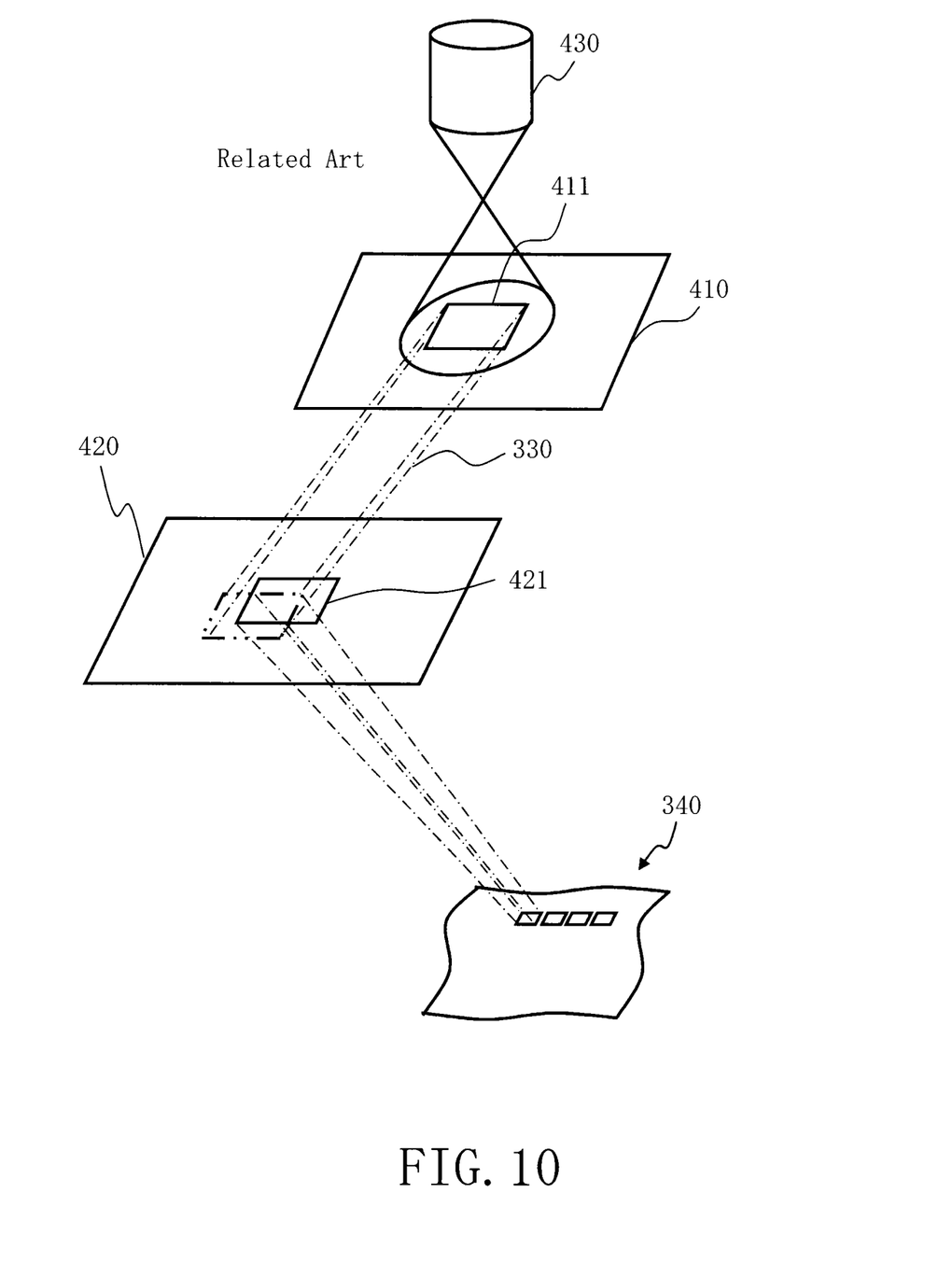
FIG. 10 is a conceptual diagram explaining operations of a variable-shaped electron beam writing apparatus.

FIG. 10 is a conceptual diagram explaining operations of a variable-shaped electron beam writing or "drawing" apparatus. The variable-shaped electron beam (EB) writing apparatus operates as described below. A first aperture plate 410 has a quadrangular aperture 411 for shaping an electron beam 330. A second aperture plate 420 has a variable shape aperture 421 for shaping the electron beam 330 having passed through the aperture 411 of the first aperture plate 410 into a desired quadrangular shape. The electron beam 330 emitted from a charged particle source 430 and having passed through the aperture 411 is deflected by a deflector to pass through a part of the variable shape aperture 421 of the second aperture plate 420, and thereby to irradiate a target object or "sample" 340 placed on a stage which continuously moves in one predetermined direction (e.g., the x direction) during writing. In other words, a quadrangular shape that can pass through both the aperture 411 of the first aperture plate 410 and the variable shape aperture 421 of the second aperture plate 420 is used for pattern writing in a writing region of the target object 340 on the stage continuously moving in the x direction. This method of forming a given shape by letting beams pass through both the aperture 411 of the first aperture plate 410 and the variable shape aperture 421 of the second aperture plate 420 is referred to as a variable shaped beam (VSB) system.

In the writing apparatus, electron beams are emitted by applying an accelerating voltage to the cathode of the electron gun from a high voltage power source. Due to the high voltage power source, drifts may occur in the accelerating voltage with the passage of a long period of time although they are minute variations in the range of specification values. It is reported that the beam irradiation position deviates by variation of the accelerating voltage, etc. (e.g., refer to Re-publication of PCT International Application No. 2009/136441). Since the accelerating voltage in which drifts occur is a high voltage, it has been difficult to highly accurately measure a minute variation of the accelerating voltage during an operation of the writing apparatus. Therefore, there has been a problem in that it is difficult to correct a minute drift itself of the accelerating voltage. Accordingly, the writing accuracy is conventionally maintained by correcting beam variations due to drifts in the accelerating voltage by periodically performing various types of beam adjustment, instead of correcting the drift itself of the accelerating voltage. However, it takes a long time to make various beam adjustments that are executed based on a plurality of adjustment items, thereby affecting the throughput of the writing apparatus.

BRIEF SUMMARY OF THE INVENTION

According to one aspect of the present invention, a method for correcting a drift of an accelerating voltage includes measuring, after a position of a focus of a charged particle beam has been adjusted based on a first adjustment value and a predetermined time period has passed, a second adjustment value when the position of the focus of the charged particle beam is newly adjusted, calculating a deviation amount between the first adjustment value and the second adjustment value, calculating, using a correlation stored in a storage device, a correction value of an accelerating voltage to be applied to a beam source which emits the charged particle beam, where the correction value corresponds to the deviation amount, and correcting the accelerating voltage to be applied to the beam source, by using the correlation value.

According to another aspect of the present invention, a method for correcting a drift of an accelerating voltage includes newly measuring, after a deflection sensitivity of a charged particle beam has been adjusted such that a deflection region of the charged particle beam is a predetermined deflection region shape and a predetermined time period has passed, the deflection sensitivity of the charged particle beam, calculating a deviation amount of the deflection sensitivity having been measured, deviated from the predetermined deflection region shape, calculating, using a correlation stored in a storage device, a correction value of an accelerating voltage to be applied to a beam source which emits the charged particle beam, where the correction value corresponds to the deviation amount, and correcting the accelerating voltage to be applied to the beam source, by using the correlation value.

According to yet another aspect of the present invention, a method for correcting a drift of a charged particle beam includes measuring, after a position of a focus of a charged particle beam has been adjusted based on a first adjustment value and a predetermined time period has passed, a second adjustment value when the position of the focus of the charged particle beam is newly adjusted, calculating a deviation amount between the first adjustment value and the second adjustment value, calculating, using a correlation stored in a storage device, a correction value of an accelerating voltage to be applied to a beam source which emits the charged particle beam, where the correction value corresponds to the deviation amount, and correcting the accelerating voltage to be applied to the beam source, by using the correlation value.

According to yet another aspect of the present invention, a method for correcting a drift of a charged particle beam includes newly measuring, after a deflection sensitivity of a charged particle beam has been adjusted such that a deflection region of the charged particle beam is a predetermined deflection region shape and a predetermined time period has passed, the deflection sensitivity of the charged particle beam, calculating a deviation amount of the deflection sensitivity having been measured, deviated from the predetermined deflection region shape, calculating, using a correlation stored in a storage device, a correction value of an accelerating voltage to be applied to a beam source which emits the charged particle beam, where the correction value corresponds to the deviation amount, and correcting the accelerating voltage to be applied to the beam source, by using the correlation value.

According to yet another aspect of the present invention, a charged particle beam writing apparatus includes a writing mechanism configured to write a pattern on a target object by using a charged particle beam whose focus position has been adjusted based on a first adjustment value, a measurement unit configured by at least one circuit, to measure, after the focus position of the charged particle beam has been adjusted based on the first adjustment value and a predetermined time period has passed, a second adjustment value in a case where the focus position of the charged particle beam is newly adjusted, a deviation amount calculator configured by the at least one circuit, to calculate a deviation amount between the first adjustment value and the second adjustment value, a storage device configured to store a correlation between the deviation amount and a correction value of an accelerating voltage, a correction value calculator configured by the at least one circuit, to calculate, using the correlation stored in the storage device, the correction value of the accelerating voltage to be applied to a beam source which emits the charged particle beam, where the correction value corresponds to the deviation amount having been calculated, and a correction unit configured by the at least one circuit, to correct the accelerating voltage to be applied to the beam source, by using the correlation value.

DETAILED DESCRIPTION OF THE INVENTION

In the embodiments described below, there will be described a configuration in which an electron beam is used as an example of a charged particle beam. The charged particle beam is not limited to the electron beam, and other charged particle beam such as an ion beam may also be used. Moreover, a variable shaping type electron beam writing apparatus will be described as an example of a charged particle beam apparatus.

In the embodiments described below, a method and a writing apparatus that can correct a drift of an accelerating voltage will be described.

First Embodiment

Figure 1:
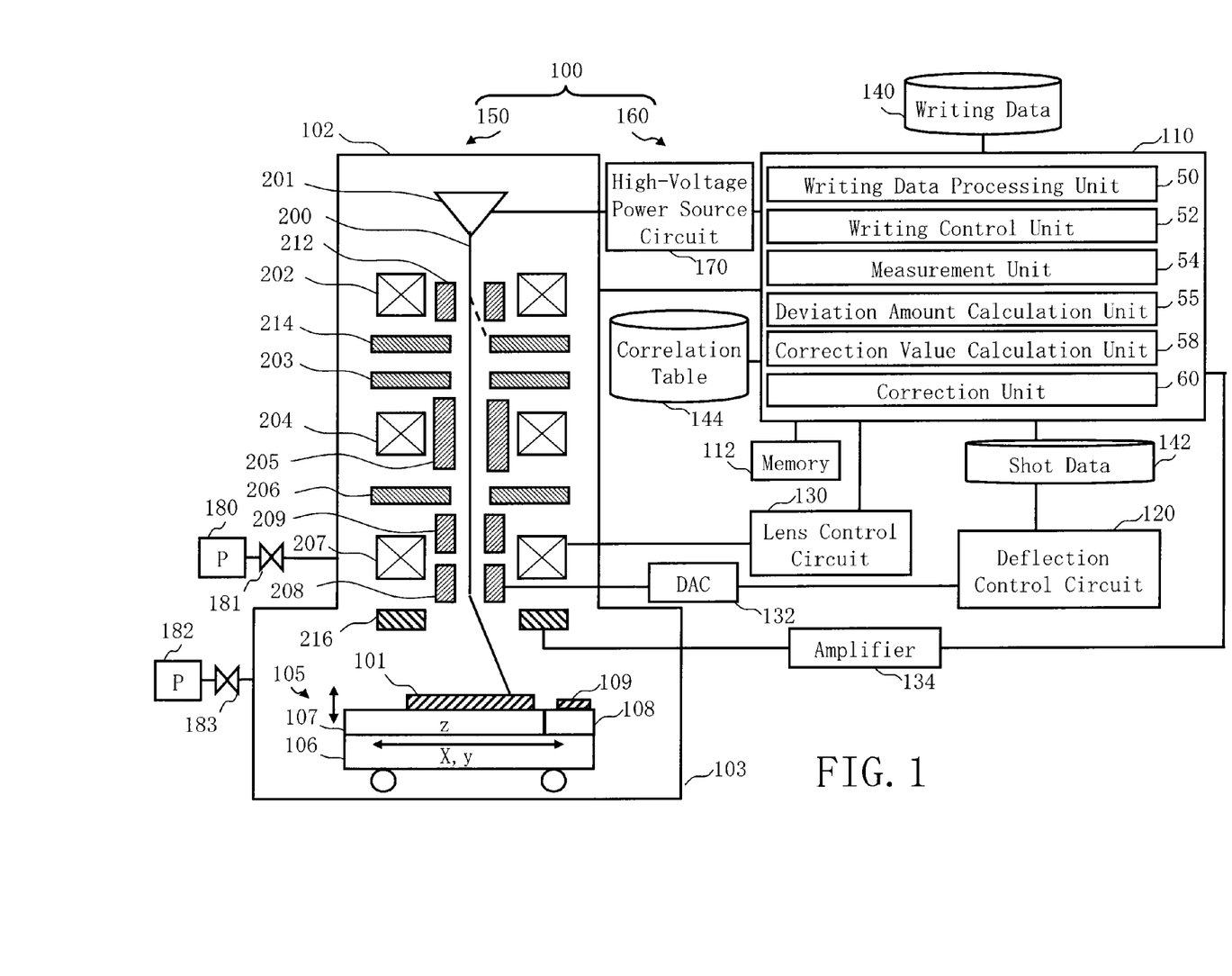
FIG. 1 is a schematic diagram showing a configuration of a writing apparatus according to a first embodiment.

FIG. 1 is a schematic diagram showing the configuration of a writing apparatus according to the first embodiment. In FIG. 1, a writing (or "drawing") apparatus 100 includes a writing unit 150 and a control unit 160. The writing apparatus 100 is an example of a charged particle beam writing apparatus, and, particularly, is an example of a variable shaping type electron beam writing apparatus. The writing unit 150 includes an electron optical column 102 and a writing chamber 103. In the electron optical column 102, there are arranged an electron gun 201, an illumination lens 202, a blanking deflector 212, a blanking aperture plate 214, a first aperture plate 203, a projection lens 204, a deflector 205, a second aperture plate 206, an objective lens 207, a detector 216, a main deflector 208, and a sub deflector 209. In the writing chamber 103, a stage 105 is arranged. The stage 105 includes an XY stage 106 that can move in the horizontal direction (x and y directions), and a Z stage 107 that is arranged on the XY stage 106 and can move in the up-and-down direction (z direction). The Z stage 107 is not arranged all over the surface of the XY stage 106 but arranged leaving a portion of the surface uncovered. A target object or "sample" 101 to be written, such as a mask, on which a layer of resist has been coated is placed on the Z stage 107. The target object 101 is, for example, an exposure mask used for manufacturing semiconductor devices. Moreover, the target object 101 may be, for example, a mask blank on which a layer of resist has been coated and no pattern has yet been written. A support member 108 being in the shape of a bar, for example, is arranged on a part of the surface region of the XY stage 106, where the Z stage 107 is not placed. Moreover, a mark 109 is arranged on the support member 108. The height position of the upper surface of the mark 109 is arranged (fixed) such that the upper surface of the target object 101 can be the same height position as that of the mark 109 by the movement of the Z stage 107.

The control unit 160 includes a control computer 110, a memory 112, a deflection control circuit 120, a lens control circuit 130, a DAC (digital/analog converter) amplifier 132, an amplifier 134, storage devices 140, 142, and 144 such as magnetic disk drives, and a high voltage power source circuit 170. The control computer 110, memory 112, deflection control circuit 120, lens control circuit 130, amplifier 134, storage devices 140, 142, and 144, and high voltage power source circuit 170 are mutually connected through a bus (not shown).

In the control computer 110, there are arranged a writing data processing unit 50, a writing control unit 52, a measurement unit 54, a deviation amount calculation unit 55 (deviation amount calculator), a correction value calculation unit 58 (correction value calculator), and a correction unit 60. A set of units, such as the writing data processing unit 50, writing control unit 52, measurement unit 54, deviation amount calculation unit 55, correction value calculation unit 58, and correction unit 60 may be configured by at least one circuit such as at least one electric circuit, at least one computer, at least one processor, at least one circuit board, or at least one semiconductor device, etc., and may be executed by the at least one circuit. Each unit of the set of units may be configured by same circuit in the at least one circuit or same circuit group in the at least one circuit, or may be configured by different circuit in the at least one circuit or different circuit group in the at least one circuit. Or a portion of the set of units may be configured by same circuit in the at least one circuit or same circuit group in the at least one circuit, and a remaining portion may be configured by different circuit in the at least one circuit or different circuit group in the at least one circuit. Data which is input and output to/from the writing data processing unit 50, writing control unit 52, measurement unit 54, deviation amount calculation unit 55, correction value calculation unit 58, and correction unit 60, and data being operated are stored in the memory 112 each time.

FIG. 1 shows a configuration necessary for explaining the first embodiment. Other configuration elements generally necessary for the writing apparatus 100 may also be included. For example, although a multiple stage deflector of two stages of the main deflector 208 and the sub deflector 209 is herein used for position deflection (objective deflection), a single stage deflector or a multiple stage deflector of three or more stages may also be used for position deflection. Moreover, input devices, such as a mouse and a keyboard, a monitoring device, an external interface circuit, etc. may be connected to the writing apparatus 100.

Figure 2:
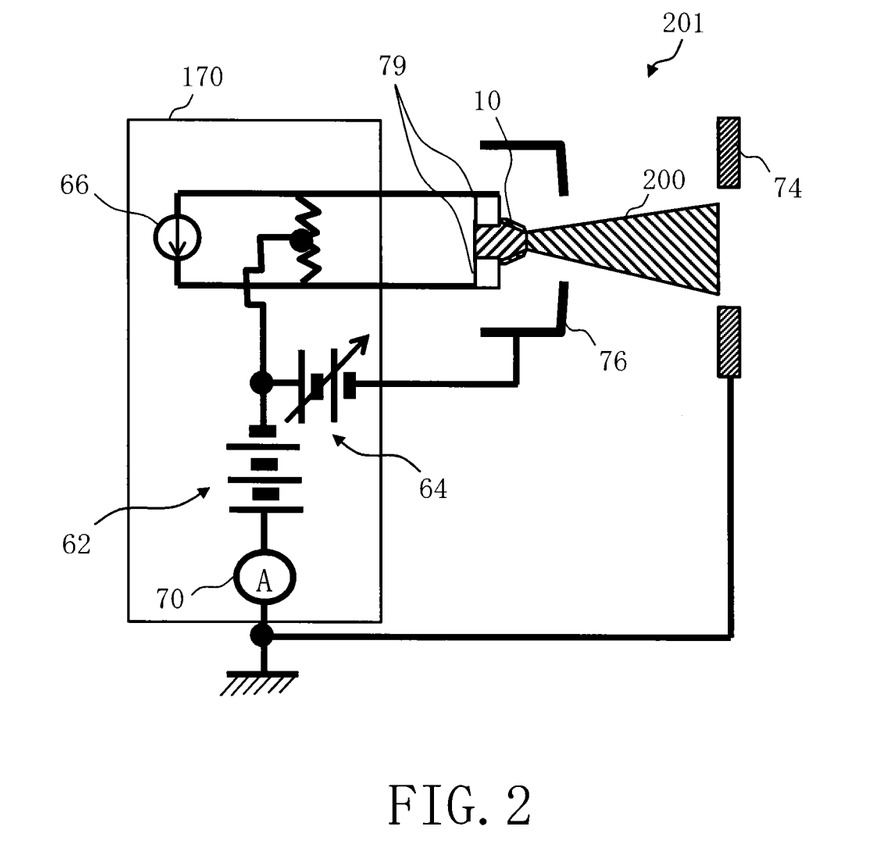
FIG. 2 shows an example of a circuit structure of an electron gun and a high voltage power source circuit according to the first embodiment.

FIG. 2 shows an example of the circuit structure of an electron gun and a high voltage power source circuit according to the first embodiment. In the high voltage power source circuit 170, there are arranged an acceleration voltage power source 62, a Wehnelt power source 64, and a heater power source 66. The pole on the cathode (−) side of the acceleration voltage power 62 is connected, in the electron gun 201, to the cathode 10 through the heater 79. The pole on the anode (+) side of the acceleration voltage power 62 is connected to the anode electrode 74 in the electron gun 201 and is grounded. Moreover, an ammeter 70 is connected in series between the pole on the anode (+) side of the acceleration voltage power source 62 and the anode electrode 74. Furthermore, the pole on the cathode (−) side of the acceleration voltage power source 62 is branched to be connected to the pole on the anode (+) side of the Wehnelt power source 64, and the pole on the cathode (−) side of the Wehnelt power source 64 is connected to the Wehnelt electrode 76 arranged between the cathode 10 and the anode electrode 74. The heater power source 66 is connected to the heater 79. At the time of electron beam emission, after the arrangement atmosphere in the electron gun 201 is maintained to be in a vacuum state of a predetermined pressure by a vacuum pump (not shown), if the cathode 10 is heated by the heater 79 in a state where a fixed negative Wehnelt voltage (bias voltage) is applied to the Wehnelt electrode 76 from the Wehnelt power source 64 and a fixed negative acceleration voltage is applied to the cathode 10 from the acceleration voltage power source 62, electrons (electron group) are emitted from the cathode 10, and the emitted electrons (electron group) become an electron beam, by being accelerated by an acceleration voltage, to advance toward the anode electrode 74.

At this time, if the accelerating voltage varies, the focus of the electron beam 200 deviates due to this variation. In other words, there is a correlation between the accelerating voltage and the beam focus. According to the first embodiment, a focus deviation is measured instead of the accelerating voltage whose minute variations are difficult to measure, and variation (drift) of the accelerating voltage is corrected based on the beam focus deviation by using the correlation. Correcting drift of the accelerating voltage leads to correcting beam drift (beam variation) due to the accelerating voltage.

Then, before starting writing processing, the correlation between an accelerating voltage and a beam focus is measured in advance by experiment etc. Specifically, the focus position of the electron beam 200 is adjusted by the objective lens 207. Then, a focus deviation is deliberately generated by varying the accelerating voltage, and the deviation amount of a lens value (adjustment value), such as a current value or a voltage value, which is output to the objective lens 207 in order to focus an electron beam to a desired position by controlling the objective lens 207 by the lens control circuit 130 is measured. In this way, the relation between the variation amount of the accelerating voltage and the deviation amount of the lens value (adjustment value) for making a focus is obtained. Then, from this relation, a correlation table (correlation) between a deviation amount of a lens value (adjustment value) for making a focus and a correction value such as a voltage value for correcting a change of an accelerating voltage is generated. The generated correlation table is stored in the storage device 144. Although the correlation table is used as an example in this case, it is not limited thereto. The correlation data may be, for example, a conversion equation etc. in addition to the table.

Figure 3:
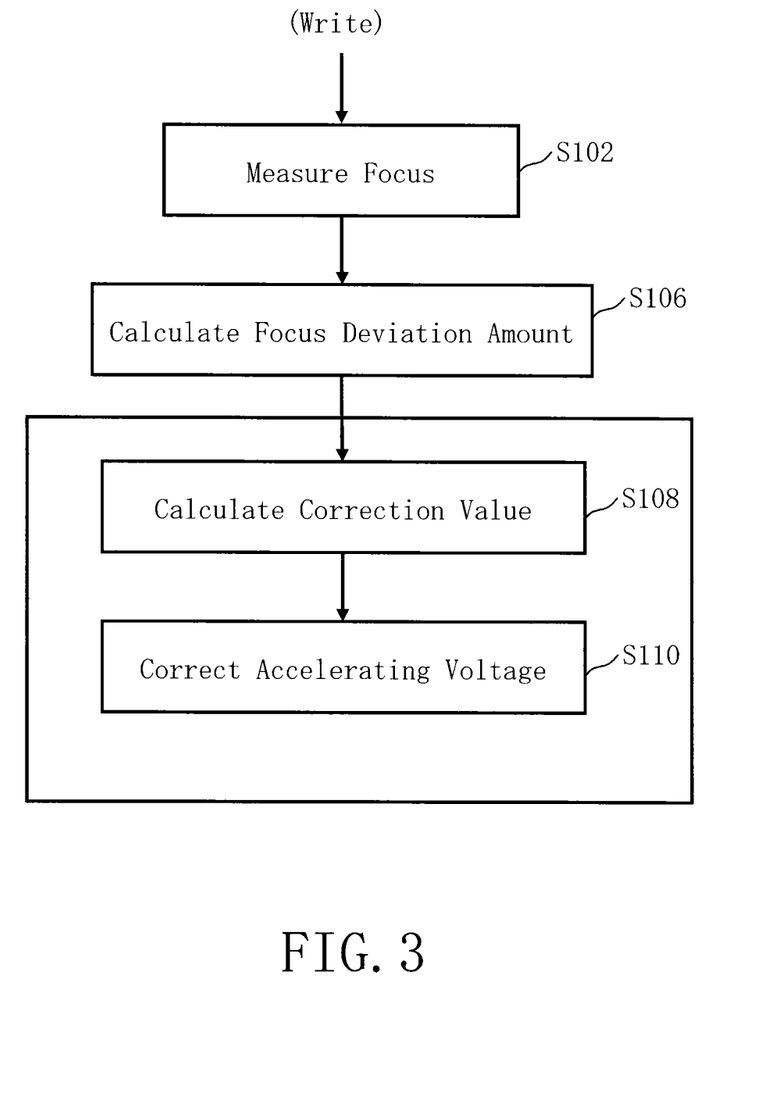
FIG. 3 is a flowchart showing main steps of a method for correcting a drift of an accelerating voltage according to the first embodiment.

FIG. 3 is a flowchart showing main steps of a method for correcting a drift of an accelerating voltage according to the first embodiment. As shown in FIG. 3, the method for correcting a drift of an accelerating voltage of the first embodiment executes a series of steps: a focus measurement step (S102), a focus deviation amount calculation step (S106), a correction value calculation step (S108), and an accelerating voltage correction step (S110).

When starting the writing apparatus 100, various beam adjustments are carried out. Therefore, the accelerating voltage itself is in a state in which the initial value is still kept because no drift has occurred. For example, an accelerating voltage of −50 kV is set in the accelerating voltage power source 62 in the high voltage power source circuit 170. Moreover, based on a lens value 1 (first adjustment value), the lens control circuit 130 controls the objective lens 207 in order to focus the electron beam 200 to a desired position. In such a situation, the writing processing of writing a pattern on the target object 101 is executed. When writing, the writing apparatus 100 operates as described below. First, the writing data processing unit 50 reads pattern data (writing data) of a chip to be written from the storage device 140, and performs data conversion processing of a plurality of steps so as to generate apparatus-specific shot data. In the pattern data of a chip, at least one or more figure pattern is defined. However, in order to write figure patterns by the writing apparatus 100, it is necessary to divide each figure pattern defined in the pattern data of a chip, to be the size that can be irradiated by one beam shot. Then, for actually performing writing, the writing data processing unit 50 generates a shot figure by dividing each figure pattern into the size that can be irradiated by one beam shot. Shot data is generated for each shot figure. In the shot data, figure data, such as a figure type, a figure size, and an irradiation position, is defined. In addition, an irradiation time in accordance with a dose is also defined. Generated shot data is sorted in the storage device 142.

In the writing apparatus 100, a writing region of the target object 101 is virtually divided into a plurality of strip-shaped stripe regions aligned along the y direction, for example, by the width deflectable by the main deflector 208. Then, each stripe region is virtually divided into a plurality of mesh-like subfields (SF) (small regions) by the size deflectable by the sub deflector 209. A shot figure corresponding to each shot position in each SF is written.

The writing apparatus 100 performs writing processing for each stripe region by using a multi-stage deflector. In this case, a two-stage deflector composed of the main deflector 208 and the sub deflector 209 is used as an example. While the XY stage 105 is continuously moving in the −x direction, for example, writing is performed in the x direction in the first stripe region. After the first stripe region has been written, writing is performed in the same direction or in the opposite direction in the second stripe region. Then, similarly, writing is performed in the third and subsequent stripe regions. The main deflector 208 deflects the electron beam 200, in order, to a reference position of SF such that the movement of the XY stage 105 is followed. The sub deflector 209 deflects the electron beam 200 from the reference position of each SF to each shot position of an irradiating beam in the SF concerned. Thus, the main deflector 208 and the sub deflector 209 have different size deflection regions.

The deflection control circuit 120 generates main deflection data and sub deflection data according to the position defined in shot data. Similarly, the deflection control circuit 120 generates blanking data based on the shot data or irradiation time data (dose data) separately prepared. Similarly, the deflection control circuit 120 generates shaping data according to the figure type and size defined in the shot data. The main deflection data is output to the DAC amplifier 132. The sub deflection data is output to a DAC amplifier for sub deflection (not shown). The blanking data is output to a DAC amplifier for blanking control (not shown). The shaping data is output to a DAC amplifier for beam shaping (not shown).

Then, the DAC amplifier for blanking control (not shown) converts a digital signal to an analog signal and amplifies it to be applied as a deflection voltage to the blanking deflector 212. The electron beam 200 is deflected by the deflection voltage, and switching on and off of a beam is performed. Thereby, each beam shot is formed.

The DAC amplifier for shaping deflection control (not shown) converts a digital signal to an analog signal and amplifies it to be applied as a deflection voltage to the deflector 205. The electron beam 200 is deflected by the deflection voltage, and the passing position of the opening in the second aperture plate 206 of the electron beam 200 having passed through the first aperture plate 203 is controlled. Thereby, the beam of each shot is variably shaped.

The DAC amplifier 132 converts a digital signal to an analog signal and amplifies it to be applied as a deflection voltage to the main deflector 208. The electron beam 200 is deflected by the deflection voltage, and the beam of each shot is deflected to a reference position of a predetermined subfield (SF) obtained by virtual division into meshes.

The DAC amplifier for sub deflection (not shown) converts a digital signal to an analog signal and amplifies it to be applied as a deflection voltage to the sub deflector 209. The electron beam 200 is deflected by the deflection voltage, and the beam of each shot is deflected to each shot position in a predetermined subfield (SF) obtained by virtual division into meshes.

As described above, based on a signal from each DAC amplifier controlled by the deflection control circuit 120, the writing unit 150 writes a figure pattern concerned on the target object 101 by using the electron beam 200. Specifically, it operates as described below.

When the electron beam 200 emitted from the electron gun 201 (an emission unit) passes through the blanking deflector 212 controlled by a deflection signal from the DAC amplifier for blanking, it is controlled by the blanking deflector 212 to pass through the blanking aperture plate 214 when in the "beam on" state, and to be deflected such that the entire beam is blocked by the blanking aperture plate 214 when in the "beam off" state. The electron beam 200 that has passed through the blanking aperture 214 during the period from the time of changing from the "beam off" state to the "beam on" state to the time of again changing to the "beam off" state serves as one shot of the electron beam. The blanking deflector 212 controls the direction of the passing electron beam 200 to alternately generate the "beam on" state and the "beam off" state. For example, no voltage should be applied when in the "beam on" state, and a voltage should be applied to the blanking deflector 212 when in the "beam off" state. The dose per shot of the electron beam 200 to irradiate the target object 101 is adjusted depending upon an irradiation time t of each shot.

As described above, each shot of the electron beam 200, generated by passing through the blanking deflector 212 and the blanking aperture plate 214, irradiates the whole of the first shaping aperture plate 203 having a quadrangular opening by the illumination lens 202. Here, the electron beam 200 is first shaped to a quadrangle. Then, after having passed through the first shaping aperture 203, the electron beam 200 of the first aperture image is projected onto the second shaping aperture plate 206 by the projection lens 204. The first aperture image on the second shaping aperture plate 206 is deflection controlled by the deflector 205 so as to change (variably shape) the beam shape and the beam size. Such variable beam shaping is performed for each shot, and, generally, each shot is shaped to have a different shape and size. Then, after having passed through the second shaping aperture plate 206, the electron beam 200 of the second aperture image is focused by the objective lens 207, and deflected by the main deflector 208 and the sub deflector 209 to reach a desired position on the target object 101 placed on the XY stage 105 which is continuously moving. FIG. 1 shows the case of using multiple stage deflection of the main and sub deflection for position deflection. In such a case, the electron beam 200 of a shot concerned is deflected to a reference position of an SF by the main deflector 208 while the movement of the stage is followed, and the beam of the shot concerned should be deflected to each irradiation position in the SF by the sub deflector 209. A desired pattern is written by repeating such operations and combining a shot figure of each shot. The writing operation is performed for each stripe region.

While repeatedly performing the writing operation described above, with the passage of time, a minute variation (drift) occurs in the accelerating voltage to be applied from the high voltage power source circuit 170 to the electron gun 201.

In the focus measurement step (S102), after the focus position of the electron beam 200 having been adjusted based on the lens value 1 (first adjustment value), the measurement unit 54 measures, when a predetermined time period has passed, a lens value 2 (second adjustment value) in the case of newly adjusting the focus position of the electron beam 200.

Figure 4:
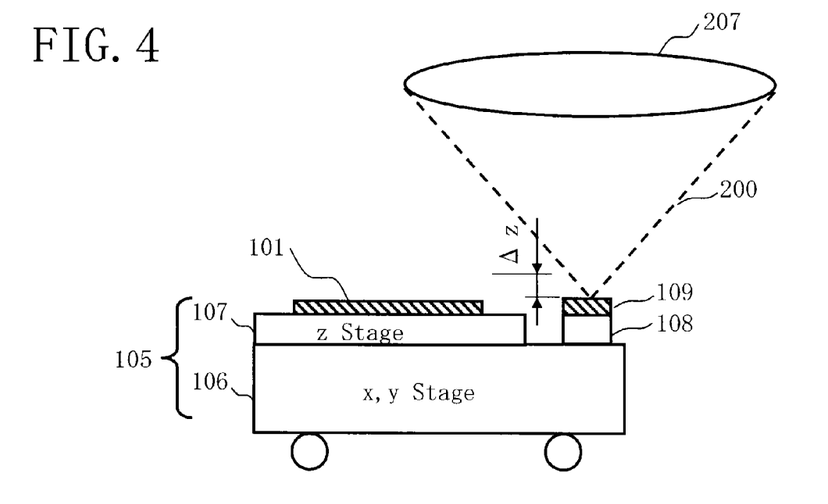
FIG. 4 is a conceptual diagram illustrating a method of focus adjustment according to the first embodiment.

FIG. 4 is a conceptual diagram illustrating a method of focus adjustment according to the first embodiment. The focus of the electron beam 200 is adjusted on the fixed mark 109 in advance. The adjustment is performed by changing excitation of the objective lens 207.

Figure 5:
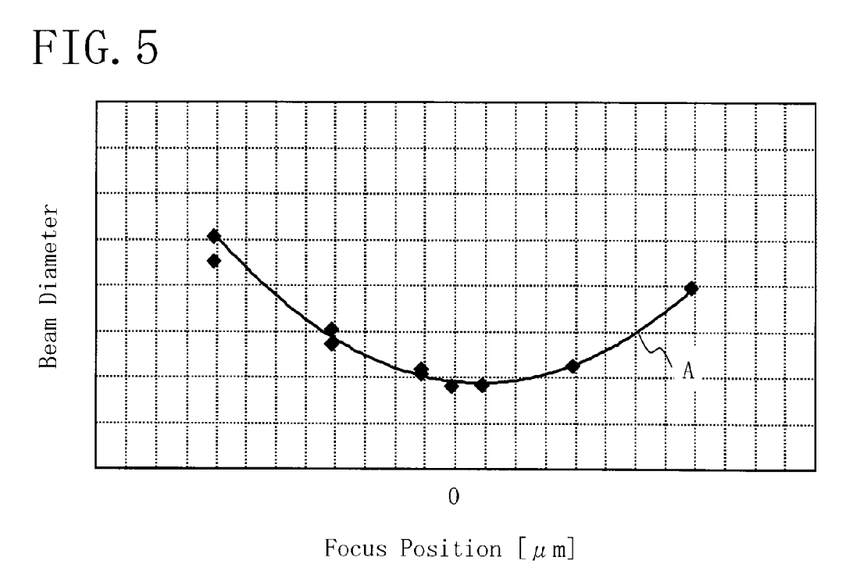
FIG. 5 shows an example of a graph illustrating a deviation of a focus position according to the first embodiment.

FIG. 5 shows an example of a graph illustrating a deviation of a focus position according to the first embodiment. In FIG. 5, the ordinate axis shows a beam diameter, and the abscissa axis shows a focus position. As shown in FIG. 5, the focus position "0" indicates a reference position which has been focus-adjusted at the position of the mark 109. The focus position is adjusted to be corresponding to an inflection point where the beam diameter is the smallest at the position of the mark 109. The beam diameter should be obtained from a measurement result of measuring, by the detector 216, a reflection electron or a secondary electron of the electron beam 200 irradiating the mark 109.

When writing, the Z stage 107 is moved in the z direction by ΔZ so that the height position of the upper surface (writing surface) of the target object 101 may be equal to that of the surface of the fixed mark 109. For example, the height positions of the surface of the target object 101 and the surface of the mark 109 are measured by a Z sensor (not shown), and then, the Z stage 107 should be moved such that the height position of the surface of the target object 101 is equal to that of the surface of the mark 109. The focus position firstly adjusted based on the lens value 1 (excitation value 1) deviates due to temporal variation. Then, an adjustment is newly made in order to eliminate the focus deviation by a focal adjustment based on the lens value 2 (excitation value 2).

In the focus deviation amount calculation step (S106), the deviation amount calculation unit 55 calculates a deviation amount (difference) between the lens value 1 (excitation value 1: first adjustment value) and the lens value 2 (excitation value 2: second adjustment value).

In the correction value calculation step (S108), using the read correlation table from the storage device 144, the correction value calculation unit 58 reads a correlation table (correlation) from the storage device 144 (storage unit), and calculates a correction value of the accelerating voltage to be applied to the electron gun 201 (beam source) which emits the electron beam 200, in order to deal with the deviation amount of the lens value.

Figure 6:
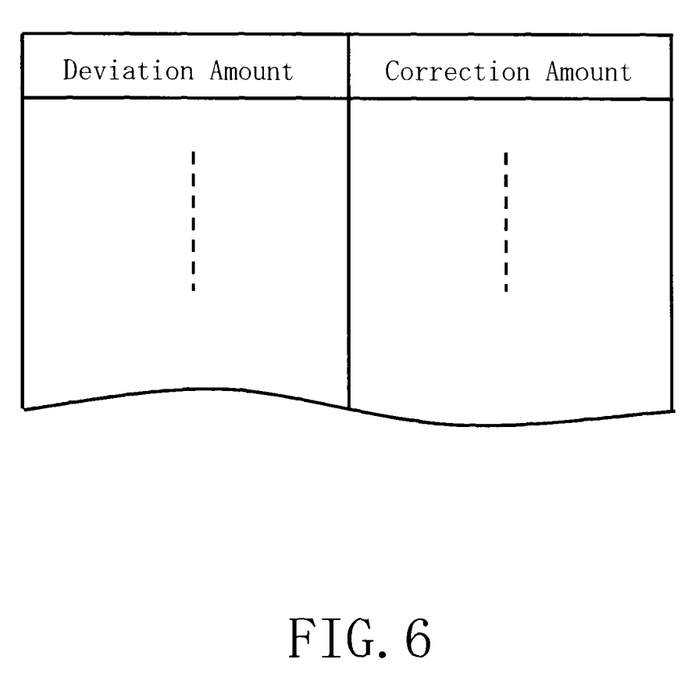
FIG. 6 shows an example of a correlation table according to the first embodiment.

FIG. 6 shows an example of a correlation table according to the first embodiment. In FIG. 6, there are defined correction values of the accelerating voltage respectively corresponding to deviation amounts of a lens value. The correction value calculation unit 58 reads a correction value of the accelerating voltage corresponding to a deviation amount of the lens value. When an exactly corresponding deviation amount is not defined in the correlation table, a desired correction value of the accelerating voltage should be obtained by performing a linear interpolation, etc. between correction values of the accelerating voltage corresponding to deviation amounts before and after the desired correction value defined in the correlation table.

In the accelerating voltage correction step (S110), the correction unit 60 generates a correction control signal for correcting an accelerating voltage applied to the electron gun 201 by using the obtained correction value, and outputs it to the high voltage power source circuit 170. In the high voltage power source circuit 170 (an example of a correction unit), the accelerating voltage power 62 performs correction by adding a voltage corresponding to the input correction control signal to the accelerating voltage. Then, the corrected accelerating voltage is applied to the electron gun 201. For example, a correction voltage of several V to several 1000 V is added. The polarity of the positive or negative of a correction voltage should be changed depending on a deviation amount. The subsequent writing processing will be performed using the electron beam 200 emitted from the electron gun 201 to which the corrected accelerating voltage has been applied. Thus, even if it is difficult to measure a variation of the accelerating voltage by a voltmeter, the amount of drifting can be corrected by adjusting an applied voltage with the accelerating voltage power source 62 at the voltage applying side.

After correcting the accelerating voltage, it is preferable to check whether the focus deviation has been corrected by again performing the focus measurement step (S102). The focus varies according to causes other than drifting of the accelerating voltage. However, when even a part of focus deviation is corrected by correcting the accelerating voltage, it turns out that the focus deviation caused by drifting of the accelerating voltage has been corrected. Moreover, conversely, when even a part of focus deviation has been corrected, it turns out that the drift of the accelerating voltage has been corrected.

Figure 7:
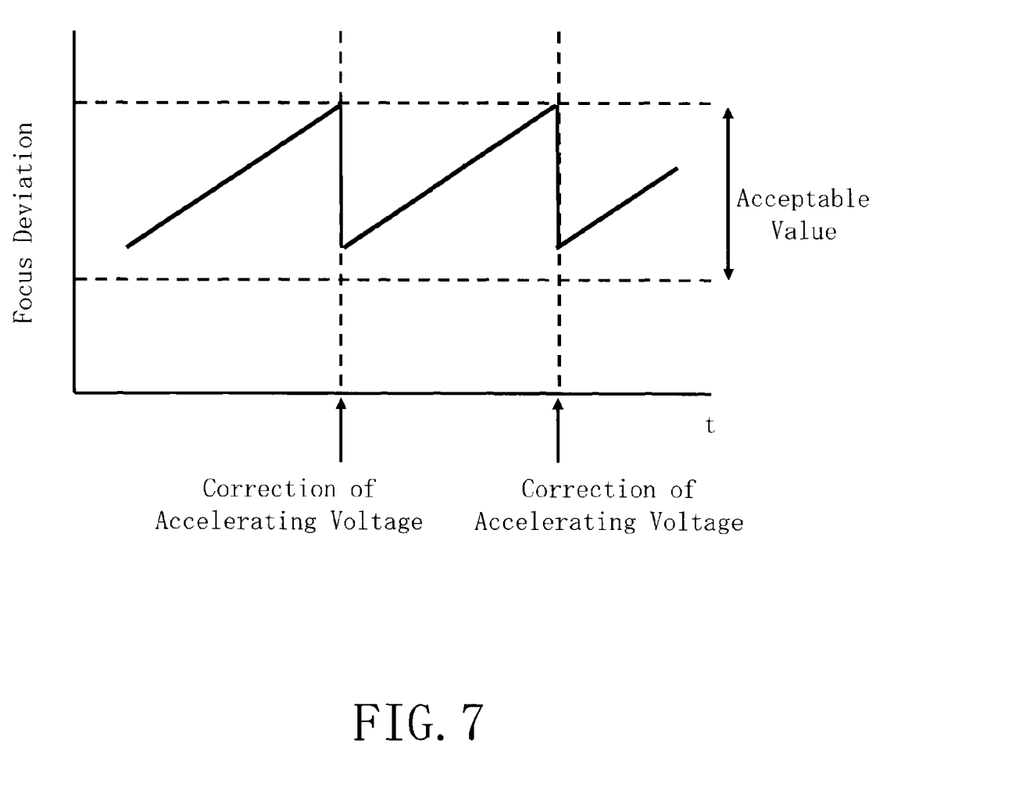
FIG. 7 shows a relation between a focus deviation and an elapsed time according to the first embodiment.

FIG. 7 shows a relation between a focus deviation and an elapsed time according to the first embodiment. As shown in FIG. 7, although the amount of focus deviation becomes larger with the passage of time, it can be reset by correcting a drift of the accelerating voltage. The frequency (cycle) of performing drift correction of the accelerating voltage is preferably adjusted to be performed before the amount of focus deviation exceeds an acceptable value. For example, it is preferable to execute the correction per several weeks or months.

By what is described above, drift of an accelerating voltage can be corrected according to the first embodiment. Therefore, the long-term stability of the accelerating voltage can be achieved. Consequently, execution frequencies of various beam adjustments which are executed for a plurality of adjustment items can be reduced. Moreover, since drifting of an accelerating voltage can be corrected by adjusting a focus deviation, the number of items for adjustment can be greatly reduced compared with the conventional case, thereby inhibiting degradation of throughput. Correcting a drift of an accelerating voltage also serves as correcting a drift of a beam.

Second Embodiment

In the first embodiment, there has been described the structure in which correcting drifts of an accelerating voltage is performed while directing attention to the correlation between the accelerating voltage and the focus of a beam. However, it is not limited thereto. In the second embodiment, there will be described a structure in which the correlation between an accelerating voltage and a deflection sensitivity of a beam by using a deflector. The structure of the writing apparatus 100 is the same as that of FIG. 1. The contents of the present embodiment are the same as those of the first embodiment except what is described below.

If the accelerating voltage varies, a deflection sensitivity of a beam by a deflector also deviates due to this variation, in addition to a focus deviation of the electron beam 200. In other words, there is a correlation between the accelerating voltage and the deflection sensitivity of a beam. Then, according to the second embodiment, deviation of a deflection sensitivity is measured instead of the accelerating voltage whose minute variations are difficult to measure, and variation (drift) of the accelerating voltage is corrected based on the deviation of the deflection sensitivity of a beam by using the correlation. Correcting drift of the accelerating voltage leads to correcting beam drift (beam variation) due to the accelerating voltage.

Then, before starting writing processing, the correlation between an accelerating voltage and a deflection sensitivity of a beam is measured in advance by experiment etc. Specifically, the electron beam 200 is deflected by the main deflector 208 to the reference position of a desired SF in the deflection region of the main deflector 208, for example. Then, deviation of a deflection sensitivity is deliberately generated by varying the accelerating voltage, and deflection positions in the case of deflecting the electron beam 200 to a plurality of positions in the deflection region by controlling the main deflector 208 by the deflection control circuit 120 are measured in order to obtain a deflection region shape that can be deflected. Then, each of deviation amounts of the deflection positions (deviation amount of deflection region shape: deviation amount of deflection sensitivity) is measured. In this way, the relation between the variation amount of the accelerating voltage and the deviation amount of the deflection sensitivity is obtained. Then, from this relation, the deviation amount of the deflection sensitivity and the variation of the accelerating voltage are corrected. For example, a correlation table (correlation) between correction values, such as voltage values, and deviation amounts of the deflection sensitivity is generated. The generated correlation table is stored in the storage device 144. Although the correlation table is used as an example in this case, it is not limited thereto. The correlation data may be, for example, a conversion equation etc. in addition to the table.

Figure 8:
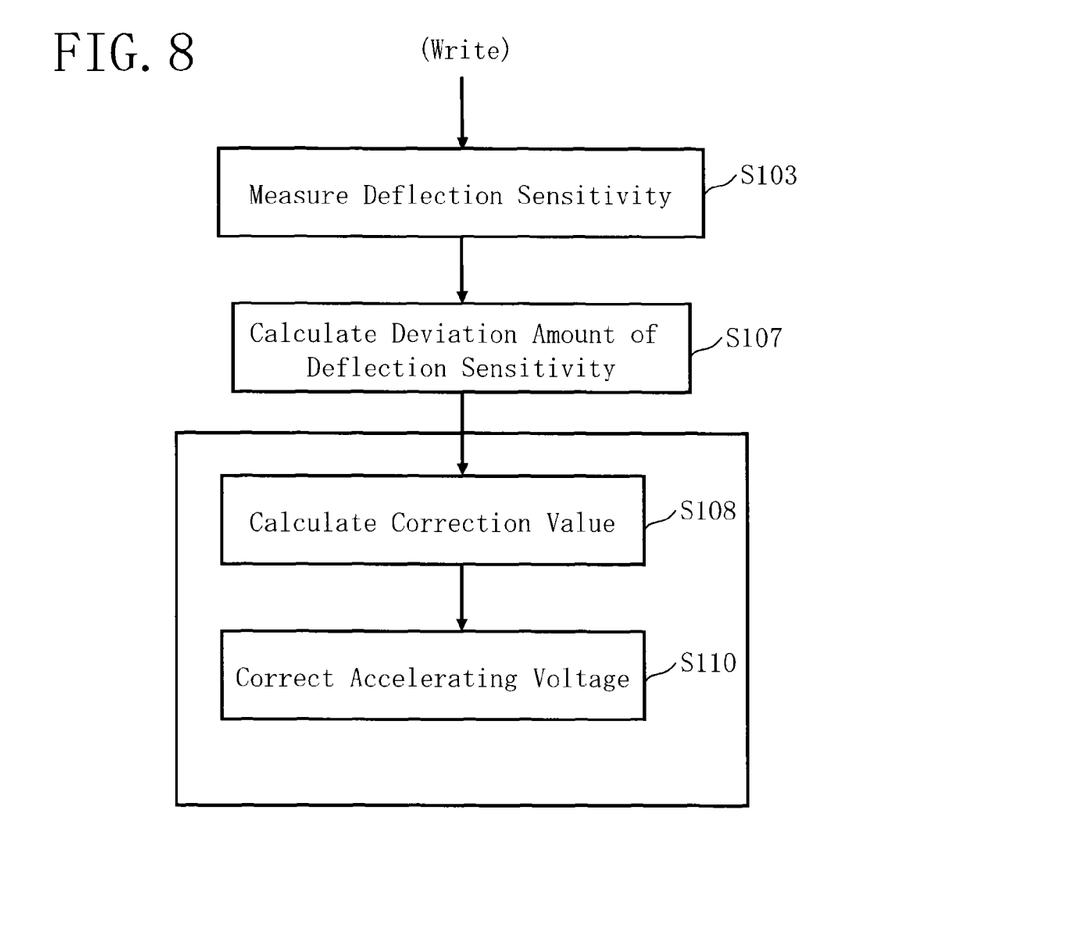
FIG. 8 is a flowchart showing main steps of a method for correcting a drift of an accelerating voltage according to a second embodiment.

FIG. 8 is a flowchart showing main steps of a method for correcting a drift of an accelerating voltage according to the second embodiment. As shown in FIG. 8, the method for correcting adrift of an accelerating voltage of the second embodiment executes a series of steps: a deflection sensitivity measurement step (S103), a deflection sensitivity deviation amount calculation step (S107), a correction value calculation step (S108), and an accelerating voltage correction step (S110).

When starting the writing apparatus 100, various beam adjustments are carried out. Therefore, the accelerating voltage itself is in a state in which the initial value is still kept because no drift has occurred. For example, an accelerating voltage of −50 kV is set in the accelerating voltage power source 62 in the high voltage power source circuit 170. In the deflection control circuit 120, a deflection position is corrected so that the deflection region of the electron beam 200 by using the main deflector 208 may be a quadrangle (predetermined deflection region shape), for example, and further, a deflection sensitivity of the electron beam is adjusted by correcting the amount of deflection. The deflection sensitivity of the auxiliary deflector 209 may also be used instead of the main deflector 208. Writing processing of writing a pattern on the target object 101 is performed in this state.

While repeating to perform the same writing operation as that of the first embodiment, with the passage of time, a minute variation (drift) occurs in the accelerating voltage to be applied from the high voltage power source circuit 170 to the electron gun 201.

In the deflection sensitivity measurement step (S103), after a predetermined time period has passed after the deflection sensitivity of the electron beam 200 was adjusted so that the deflection region of the electron beam 200 may be a quadrangle (predetermined deflection region shape), the measurement unit 54 newly measures the deflection sensitivity of the electron beam 200.

Figure 9:
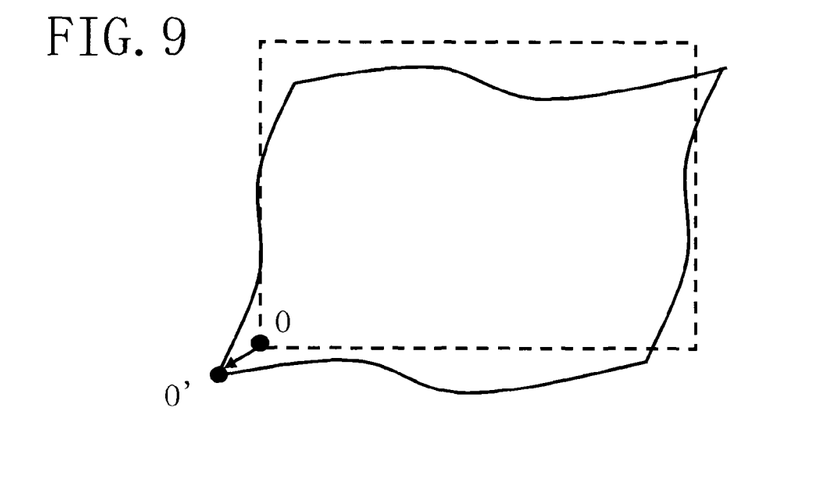
FIG. 9 illustrates measurement of a deflection sensitivity according to the second embodiment.

FIG. 9 illustrates measurement of a deflection sensitivity according to the second embodiment. The stage 105 is moved such that the mark 109 is arranged at the positions of the four corners of the quadrangular deflection region of the main deflector 208. The electron beam 200 is deflected by the main deflector 208 at each mark position, and scanning is performed over the mark 109. A reflection electron or a secondary electron at the time of scanning is detected by the detector 216. A detection signal is transmitted to the amplifier 134 to be amplified, and after being converted into a digital signal from an analog signal, it is transmitted to the measurement unit 54. The measurement unit 54 calculates a detection position of the mark 109 from the detection signal. The measurement unit 54 should calculate the shape of the deflection region based on each position measured at each of the four corner positions of the quadrangular deflection region of the main deflector 208. The shape of the deflection region is deviated from the quadrangle by deflection distortion as shown in FIG. 9. A Highly accurate deflection region shape can be acquired by performing measurement at a plurality of positions other than the four corners of the deflection region. Once the deflection region shape is known, since the difference between a desired deflection position and an actual deflection position can be obtained, it becomes possible to obtain a deflection sensitivity.

In the deflection sensitivity deviation amount calculation step (S107), the deviation amount calculation unit 55 calculates a deviation amount of the measured deflection sensitivity, deviated from the deflection region shape (predetermined deflection region shape) of the main deflector 208, which is, for example, a quadrangle. In this case, the deviation amount is calculated with respect to the reference point of the deflection region, for example, one point at the lower left corner as shown in FIG. 9. Since the deviation amounts in the x and y directions can be obtained, for example, a vector quantity from the lower left corner point O of the quadrangle to the position O' which is equivalent to the lower left corner of the distorted deflection region shape is calculated as a deviation amount.

In the correction value calculation step (S108), using a correlation stored in the storage device 144, the correction value calculation unit 58 calculates a correction value of the accelerating voltage to be applied to the electron gun 201 which emits the electron beam 200, where the correction value corresponds to the deviation amount. The contents of the accelerating voltage correction step (S110) are the same as those of the first embodiment.

After correcting the accelerating voltage, it is preferable to check whether the deflection sensitivity deviation has been corrected by again performing the deflection sensitivity measurement step (S103). The deflection sensitivity varies according to causes other than drifting of the accelerating voltage. However, when even a part of deviation of the deflection sensitivity is corrected by correcting the accelerating voltage, it turns out that the deflection sensitivity deviation caused by drifting of the accelerating voltage has been corrected. Moreover, conversely, when even a part of deviation of the deflection sensitivity has been corrected, it turns out that the drift of the accelerating voltage has been corrected.

The frequency (cycle) of performing drift correction of the accelerating voltage is preferably adjusted to be performed before the deviation amount of a deflection sensitivity exceeds an acceptable value. For example, it is preferable to execute the drift correction per several weeks or months.

By what is described above, drift of an accelerating voltage can be corrected according to the second embodiment. Therefore, the long-term stability of the accelerating voltage can be achieved. Consequently, execution frequencies of various beam adjustments which are executed for a plurality of adjustment items can be reduced. Moreover, since drifting of an accelerating voltage can be corrected by measuring deviation of a deflection sensitivity, the number of items for adjustment can be greatly reduced compared with the conventional case, thereby inhibiting degradation of throughput. Correcting a drift of an accelerating voltage also serves as correcting a drift of a beam.

Referring to specific examples, embodiments have been described above. However, the present invention is not limited to these examples.

While the apparatus configuration, control method, and the like not directly necessary for explaining the present invention are not described, some or all of them can be selectively used case-by-case basis. For example, although description of the configuration of the control unit for controlling the writing apparatus 100 is omitted, it should be understood that some or all of the configuration of the control unit can be selected and used appropriately when necessary.

Any other method for correcting a drift of an accelerating voltage, method for correcting a drift of a charged particle beam, and charged particle beam writing apparatus that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for correcting a drift of an accelerating voltage comprising:
   measuring, after a position of a focus of a charged particle beam has been adjusted based on a first adjustment value and a predetermined time period has passed, a second adjustment value when the position of the focus of the charged particle beam is adjusted;
   calculating a deviation amount between the first adjustment value and the second adjustment value;
   calculating, using a correlation stored in a storage device, a correction value of an accelerating voltage to be applied to a beam source which emits the charged particle beam, where the correction value corresponds to the deviation amount; and
   correcting the accelerating voltage to be applied to the beam source, by using the correlation value.

2. The method according to claim 1, wherein the correlation is a correlation between the accelerating voltage and the focus of the charged particle beam.

3. The method according to claim 1, wherein used as the correlation is a correlation between the accelerating voltage and the focus of the charged particle beam, which is obtained by measuring a deviation amount of an adjustment value for focusing the charged particle beam to a desired position, in a state where deviation of the focus is deliberately generated by varying the accelerating voltage.

4. A method for correcting a drift of an accelerating voltage comprising:
   measuring, after a deflection sensitivity of a charged particle beam has been adjusted such that a deflection region of the charged particle beam is a predetermined deflection region shape and a predetermined time period has passed, the deflection sensitivity of the charged particle beam;
   calculating a deviation amount of the deflection sensitivity having been measured, deviated from the predetermined deflection region shape;
   calculating, using a correlation stored in a storage device, a correction value of an accelerating voltage to be applied to a beam source which emits the charged particle beam, where the correction value corresponds to the deviation amount; and
   correcting the accelerating voltage to be applied to the beam source, by using the correlation value.

5. The method according to claim 4, wherein the correlation is a correlation between the accelerating voltage and the deflection sensitivity of the charged particle beam.

6. The method according to claim 4, wherein used as the correlation is a correlation between the accelerating voltage and the deflection sensitivity of the charged particle beam, which is obtained by measuring deflection positions when deflecting the charged particle beam to a plurality of positions in the deflection region, in a state where deviation of the deflection sensitivity is deliberately generated by varying the accelerating voltage.

7. A method for correcting a drift of a charged particle beam comprising:
   measuring, after a position of a focus of a charged particle beam has been adjusted based on a first adjustment value and a predetermined time period has passed, a second adjustment value when the position of the focus of the charged particle beam is adjusted;
   calculating a deviation amount between the first adjustment value and the second adjustment value;
   calculating, using a correlation stored in a storage device, a correction value of an accelerating voltage to be applied to a beam source which emits the charged particle beam, where the correction value corresponds to the deviation amount; and
   correcting the accelerating voltage to be applied to the beam source, by using the correlation value.

8. The method according to claim 7, wherein the correlation is a correlation between the accelerating voltage and the focus of the charged particle beam.

9. The method according to claim 7, wherein used as the correlation is a correlation between the accelerating voltage and the focus of the charged particle beam, which is obtained by measuring a deviation amount of an adjustment value for focusing the charged particle beam to a desired position, in a state where deviation of the focus is deliberately generated by varying the accelerating voltage.

10. A method for correcting a drift of a charged particle beam comprising:
    measuring, after a deflection sensitivity of a charged particle beam has been adjusted such that a deflection region of the charged particle beam is a predetermined deflection region shape and a predetermined time period has passed, the deflection sensitivity of the charged particle beam;

calculating a deviation amount of the deflection sensitivity having been measured, deviated from the predetermined deflection region shape;

calculating, using a correlation stored in a storage device, a correction value of an accelerating voltage to be applied to a beam source which emits the charged particle beam, where the correction value corresponds to the deviation amount; and correcting the accelerating voltage to be applied to the beam source, by using the correlation value.

11. The method according to claim 10, wherein the correlation is a correlation between the accelerating voltage and the deflection sensitivity of the charged particle beam.

12. The method according to claim 10, wherein used as the correlation is a correlation between the accelerating voltage and the deflection sensitivity of the charged particle beam, which is obtained by measuring deflection positions when deflecting the charged particle beam to a plurality of positions in the deflection region, in a state where deviation of the deflection sensitivity is deliberately generated by varying the accelerating voltage.

13. A charged particle beam writing apparatus comprising:

a writing mechanism configured to write a pattern on a target object by using a charged particle beam whose focus position has been adjusted based on a first adjustment value;

a measurement unit configured by at least one circuit, to measure, after the focus position of the charged particle beam has been adjusted based on the first adjustment value and a predetermined time period has passed, a second adjustment value in a case where the focus position of the charged particle beam is adjusted;

a deviation amount calculator configured by the at least one circuit, to calculate a deviation amount between the first adjustment value and the second adjustment value;

a storage device configured to store a correlation between the deviation amount and a correction value of an accelerating voltage;

a correction value calculator configured by the at least one circuit, to calculate, using the correlation stored in the storage device, the correction value of the accelerating voltage to be applied to a beam source which emits the charged particle beam, where the correction value corresponds to the deviation amount having been calculated; and a correction unit configured by the at least one circuit, to correct the accelerating voltage to be applied to the beam source, by using the correlation value.

* * * * *